(12) United States Patent
Kim et al.

(10) Patent No.: US 11,411,138 B2
(45) Date of Patent: Aug. 9, 2022

(54) DISPLAY DEVICE USING SEMICONDUCTOR LIGHT EMITTING DEVICE SURROUNDED BY CONDUCTIVE ELECTRODE AND METHOD FOR MANUFACTURING THE SAME

(71) Applicant: LG ELECTRONICS INC., Seoul (KR)

(72) Inventors: Junghoon Kim, Seoul (KR); Byoungkwon Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 177 days.

(21) Appl. No.: 16/774,787

(22) Filed: Jan. 28, 2020

(65) Prior Publication Data

US 2020/0168589 A1  May 28, 2020

Related U.S. Application Data

(63) Continuation of application No. 16/415,541, filed on May 17, 2019, now Pat. No. 10,573,626.

(30) Foreign Application Priority Data

Oct. 25, 2018 (KR) ........................ 10-2018-0128470

(51) Int. Cl.
*H01L 33/38* (2010.01)
*H01L 25/075* (2006.01)
(Continued)

(52) U.S. Cl.
CPC .............. *H01L 33/38* (2013.01); *H01L 24/95* (2013.01); *H01L 25/0753* (2013.01);
(Continued)

(58) Field of Classification Search
CPC ....... H01L 33/36–42; H01L 33/44–465; H01L 33/62; H01L 33/38
See application file for complete search history.

(56) References Cited

U.S. PATENT DOCUMENTS 7,683,385 B2  3/2010 Lee et al.
9,825,202 B2  11/2017 Schuele et al.
(Continued)

FOREIGN PATENT DOCUMENTS

JP   2014-241401 A   12/2014
KR   10-0714638 B1    5/2007
(Continued)

*Primary Examiner* — Scott B Geyer
(74) *Attorney, Agent, or Firm* — Birch, Stewart, Kolasch & Birch, LLP

(57) ABSTRACT

The present disclosure relates to a display device and a fabrication method thereof, and more particularly, to a display device using a semiconductor light emitting device. The display device includes a semiconductor light emitting device disposed on a substrate, and having a first conductive electrode disposed on an upper edge of the semiconductor light emitting device, and a second conductive electrode disposed on an upper central portion of the semiconductor light emitting device and surrounded by the first conductive electrode, a passivation layer disposed to cover a part of an upper surface of the semiconductor light emitting device, a first wiring electrode electrically connected to the first conductive electrode and a second wiring electrode electrically connected to the second conductive electrode.

19 Claims, 19 Drawing Sheets

(51) Int. Cl.
*H01L 33/24* (2010.01)
*H01L 33/44* (2010.01)
*H01L 33/62* (2010.01)
*H01L 23/00* (2006.01)

(52) U.S. Cl.
CPC .............. *H01L 33/24* (2013.01); *H01L 33/44* (2013.01); *H01L 33/62* (2013.01); *H01L 2224/95085* (2013.01); *H01L 2224/95133* (2013.01); *H01L 2924/12041* (2013.01); *H01L 2933/0016* (2013.01); *H01L 2933/0025* (2013.01); *H01L 2933/0066* (2013.01)

(56) References Cited

U.S. PATENT DOCUMENTS

| | | |
|---|---|---|
| 9,876,147 B2 | 1/2018 | Kawaguchi et al. |
| 9,887,334 B1* | 2/2018 | Jeon ................. H01L 33/44 |
| 2007/0131958 A1* | 6/2007 | Hsu .................. H01L 27/15 257/99 |
| 2010/0210051 A1 | 8/2010 | Lee et al. |
| 2010/0258826 A1 | 10/2010 | Takeuchi |
| 2013/0161675 A1 | 6/2013 | Lee et al. |
| 2015/0214430 A1 | 7/2015 | Zhan et al. |
| 2016/0284941 A1* | 9/2016 | Seo .................... H01L 33/42 |
| 2017/0133550 A1 | 5/2017 | Schuele et al. |
| 2017/0222108 A1* | 8/2017 | Chang ............... H01L 33/62 |
| 2018/0102460 A1 | 4/2018 | Kawaguchi et al. |
| 2019/0103512 A1* | 4/2019 | Hung ................. H01L 33/06 |
| 2019/0148601 A1* | 5/2019 | Park .................. H01L 25/18 257/88 |
| 2019/0214514 A1* | 7/2019 | Hong ................. H01L 33/44 |
| 2019/0267527 A1* | 8/2019 | Emura ............... H01L 27/153 |
| 2019/0273180 A1 | 9/2019 | Oh |

FOREIGN PATENT DOCUMENTS

| | | |
|---|---|---|
| KR | 10-2016-0014263 A | 2/2016 |
| KR | 10-1620469 B1 | 5/2016 |

\* cited by examiner (a)

(b)

(c)

DISPLAY DEVICE USING SEMICONDUCTOR LIGHT EMITTING DEVICE SURROUNDED BY CONDUCTIVE ELECTRODE AND METHOD FOR MANUFACTURING THE SAME

CROSS-REFERENCE TO RELATED APPLICATION

This application is a Continuation of U.S. patent application Ser. No. 16/415,541, filed on May 17, 2019 (now U.S. Pat. No. 10,573,626, issued on Feb. 25, 2020), which claims the benefit of priority to Korean Application No. 10-2018-0128470, filed on Oct. 25, 2018, all of these applications are hereby expressly incorporated by reference into the present application.

BACKGROUND OF THE INVENTION

1. Field of the Invention

The present disclosure relates to a display device and a fabrication method thereof, and more particularly, to a display device using a semiconductor light emitting device.

2. Description of the Related Art

In recent years, liquid crystal displays (LCDs), organic light emitting diode (OLED) displays, and micro LED displays have been competing to implement a large-area display in the field of display technology.

However, there exist problems such as a slow response time, low efficiency of light generated by backlight in case of LCDs, and there exist drawbacks such as a short life span, reduced yield as well as low efficiency in case of OLEDs.

On the contrary, when semiconductor light emitting devices (micro LED (µLED)) having a diameter or a cross sectional area of 100 microns or less are used in a display, the display can provide a very high efficiency because it does not absorb light using a polarizing plate or the like. However, since a large-sized display requires millions of semiconductor light emitting devices, it has difficulty in transferring the devices compared to other technologies.

Technologies currently in development for transfer processes include pick & place, laser lift-off (LLO), self-assembly, or the like. Among them, the self-assembly method, which is a method in which the semiconductor light emitting device locates themselves in a fluid, is the most advantageous method for realizing a large-sized display device.

In recent years, U.S. Pat. No. 9,825,202 proposed a micro LED structure suitable for self-assembly, but there is not yet research on technologies for fabricating a display through self-assembly of micro LEDs. Accordingly, the present disclosure proposes a new type of display device in which micro LEDs can be self-assembled and a fabrication method thereof.

SUMMARY OF THE INVENTION

An object of the present disclosure is to provide a fabrication method and structure for reducing a process error in fabricating a display device including semiconductor light emitting devices.

Another object of the present disclosure is to provide a fabrication method and structure for reducing the number of processes required in fabricating a display device including semiconductor light emitting devices.

The present disclosure can provide a display device, including a substrate, semiconductor light emitting device having a first conductive electrode disposed on the substrate and formed annularly on an upper edge thereof and a second conductive electrode formed on an upper central portion thereof and surrounded by the first conductive electrode, a passivation layer formed to cover a part of an upper surface of the semiconductor light emitting device, a first wiring electrode electrically connected to the first conductive electrode, and a second wiring electrode extended from the upper edge of the semiconductor light emitting device to the upper central portion of the semiconductor light emitting device and electrically connected to the second conductive electrode, wherein a part of the second wiring electrode overlaps with a part of the first conductive electrode with the passivation layer interposed therebetween.

According to an embodiment, the passivation layer can be extended from a side surface of the semiconductor light emitting device in a width direction of the semiconductor light emitting device, and formed to cover parts of the first and second conductive electrodes.

According to an embodiment, the passivation layer can be formed to cover a remaining portion of the upper surface of the semiconductor light emitting device excluding a portion of the first and second conductive electrodes electrically connected to the first and second wiring electrodes.

According to an embodiment, the semiconductor light emitting device can be formed symmetrically with respect to a widthwise center line thereof.

According to an embodiment, the first and second conductive electrodes can be disposed with a height difference with respect to a thickness direction of the semiconductor light emitting device.

According to an embodiment, the semiconductor light emitting device can include a first conductive semiconductor layer disposed below the first conductive electrode, a second conductive semiconductor layer disposed below the second conductive electrode, and an active layer formed between the first and second conductive semiconductor layers.

According to an embodiment, the active layer can be formed to overlap with the second conductive electrode disposed at a central portion of the semiconductor light emitting device.

According to an embodiment, the active layer can be formed in an annular shape to overlap with the first conductive electrode.

In addition, the present disclosure can provide a fabrication method of a display device, and the method can include fabricating a plurality of semiconductor light emitting devices each having a first conductive electrode formed annularly on an upper edge thereof and a second conductive electrode formed at an upper central portion of the semiconductor light emitting device and surrounded by the first conductive electrode on a wafer, forming a passivation layer that covers an upper surface of the semiconductor light emitting device, transferring a substrate to an assembly position, and placing the semiconductor light emitting devices into a fluid chamber, guiding the movement of the semiconductor light emitting devices in the fluid chamber to assemble the semiconductor light emitting devices at preset positions of the substrate, etching parts of the passivation layer overlapping with the first and second conductive electrodes to expose portions of the first and second conductive electrodes, and connecting first and second wiring electrodes to the first and the second conductive electrodes.

According to an embodiment, forming the passivation layer can be carried out to cover an entire upper surface of the semiconductor light emitting device.

According to an embodiment, etching the passivation layer can be carried out subsequent to assembling the plurality of semiconductor light emitting devices at the preset positions of the substrate.

According to an embodiment, part of the second wiring electrode can be disposed to overlap with a part of the first conductive electrode with the passivation layer interposed therebetween.

According to the present disclosure, it is not required to perform the process of exposing conductive electrodes of semiconductor light emitting devices to the outside in the fabrication of the semiconductor light emitting devices. As a result, the number of processes is reduced, and the process error is reduced. Moreover, the size of the semiconductor light emitting device can be reduced due to the reduction in the process error.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
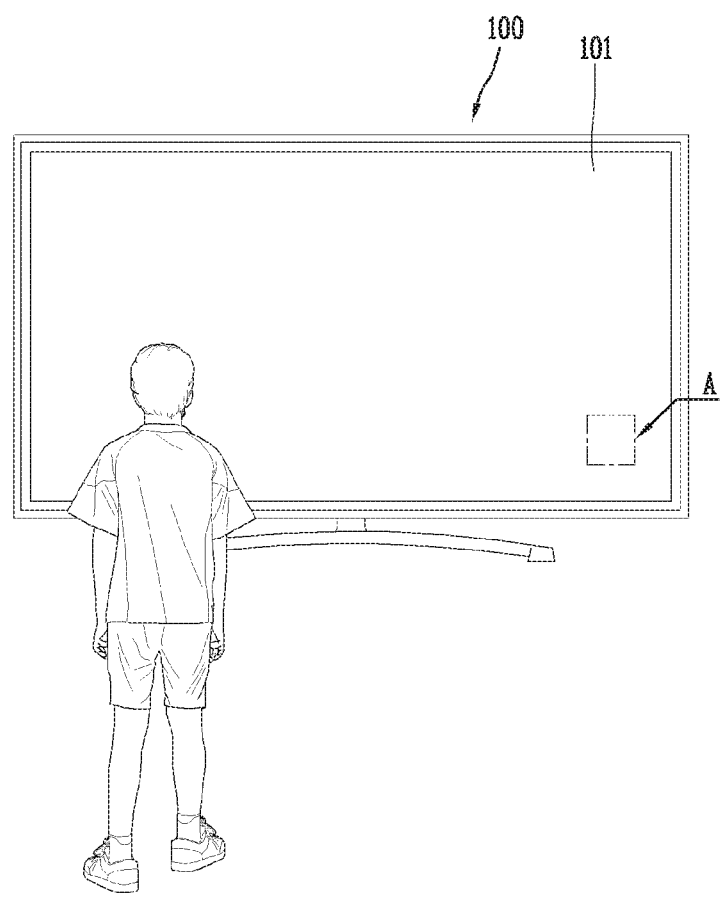
FIG. 1 is a view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element can also be interposed therebetween.

A display device disclosed herein can include a portable phone, a smart phone, a laptop computer, a digital broadcast terminal, a personal digital assistant (PDA), a portable multimedia player (PMP), a navigation, a slate PC, a tablet PC, an ultrabook, a digital TV, a digital signage, a head-mounted display (HMD), a desktop computer, and the like. However, it would be easily understood by those skilled in the art that a configuration disclosed herein can be applicable to any displayable device even though it is a new product type which will be developed later.

Figure 2:
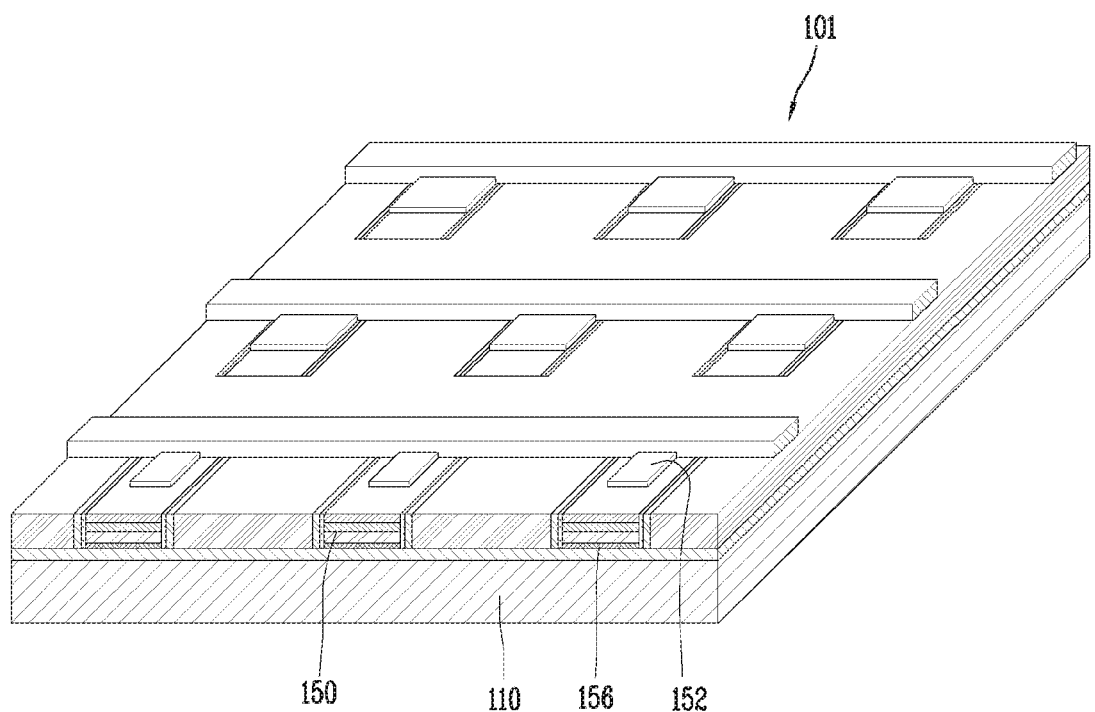
FIG. 2 is a partially enlarged view showing a portion "A" of the display device in FIG. 1.
Figure 3:
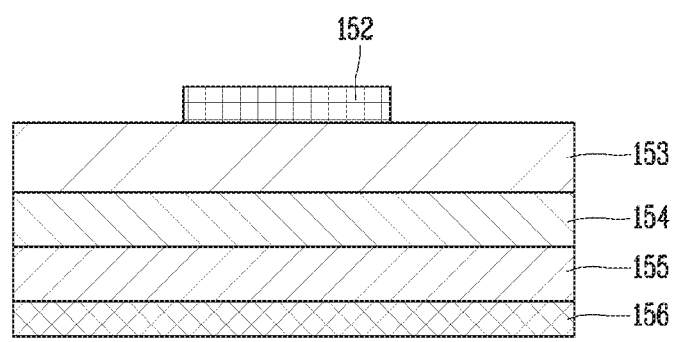
FIG. 3 is an enlarged view showing a semiconductor light emitting device in FIG. 2.
Figure 4:
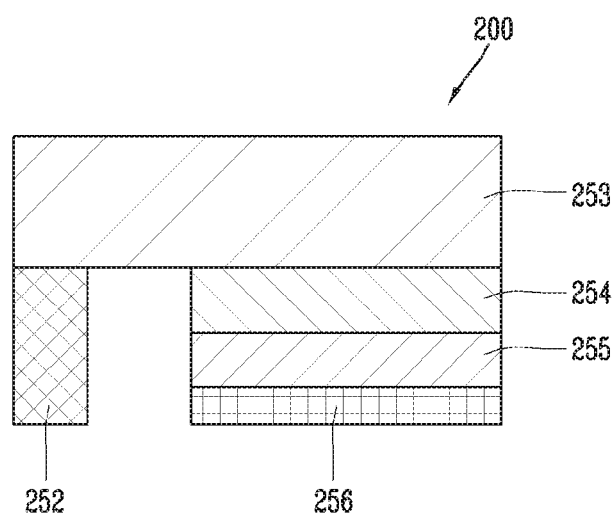
FIG. 4 is an enlarged view showing another embodiment of the semiconductor light emitting device in FIG. 2.

FIG. 1 is a view showing a display device using a semiconductor light emitting device according to an embodiment of the present disclosure, and FIG. 2 is a partially enlarged view showing a portion "A" of the display device in FIG. 1, and FIG. 3 is an enlarged view showing a semiconductor light emitting device in FIG. 2, and FIG. 4 is an enlarged view showing another embodiment of the semiconductor light emitting device in FIG. 2.

According to the illustration, information processed in the controller of the display device 100 can be displayed on a display module 101. A case in the form of a closed loop surrounding an edge of the display module can form a bezel of the display device.

The display module 101 can include a panel on which an image is displayed, and the panel can include micro-sized semiconductor light emitting devices 150 and a wiring substrate 110 on which the semiconductor light emitting devices 150 are mounted.

Wiring lines can be formed on the wiring substrate 110, and connected to an n-type electrode 152 and a p-type electrode 156 of the semiconductor light emitting device 150. Through this, the semiconductor light emitting device 150 can be provided on the wiring substrate 110 as a self-emitting individual pixel.

An image displayed on the panel is visual information, and implemented by independently controlling the light emission of a sub-pixel arranged in a matrix form through the wiring lines.

According to the present invention, a micro LED (Light Emitting Diode) is illustrated as one type of the semiconductor light emitting device 150 that converts current into light. The micro LED can be a light emitting diode formed with a small size of 100 microns or less. The semiconductor light emitting device 150 can be provided in blue, red, and green light emitting regions, respectively, to implement a sub-pixel by a combination of the light emitting regions. In other words, the sub-pixel denotes a minimum unit for implementing a single color, and at least three micro LEDs can be provided in the sub-pixel.

More specifically, referring to FIG. 3, the semiconductor light emitting device 150 can be a vertical structure.

For example, the semiconductor light emitting devices 150 can be implemented with a high-power light emitting device that emits various lights including blue in which gallium nitride (GaN) is mostly used, and indium (In) and or aluminum (Al) are added thereto.

The vertical semiconductor light emitting device can include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom can be electrically connected to a p-electrode of the wiring substrate, and the n-type electrode 152 located at the top can be electrically connected to an n-electrode at an upper side of the semiconductor light emitting device. The electrodes can be disposed in the upward/downward direction in the vertical semiconductor light emitting device 150, thereby providing a great advantage capable of reducing the chip size.

For another example, referring to FIG. 4, the semiconductor light emitting device can be a flip chip type semiconductor light emitting device.

For such an example, the semiconductor light emitting device 250 can include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 can be electrically connected to the p-electrode and the n-electrode of the wiring substrate at the bottom of the semiconductor light emitting device.

The vertical semiconductor light emitting device and the horizontal semiconductor light emitting device can be a green semiconductor light emitting device, a blue semiconductor light emitting device, or a red semiconductor light emitting device, respectively. The green semiconductor light emitting device and the blue semiconductor light emitting device can be mostly formed of gallium nitride (GaN), and indium (In) and/or aluminum (Al) can be added thereto to implement a high-power light emitting device that emits green or blue light. For such an example, the semiconductor light emitting device can be a gallium nitride thin-film formed in various layers such as n-Gan, p-Gan, AlGaN, and InGa, and specifically, the p-type semiconductor layer can be p-type GaN, and the n-type semiconductor layer can be N-type GaN. However, in case of the red semiconductor light emitting device, the p-type semiconductor layer can be p-type GaAs and the n-type semiconductor layer can be n-type GaAs.

In addition, a p-electrode side in the p-type semiconductor layer can be p-type GaN doped with Mg, and an n-electrode side in the n-type semiconductor layer can be n-type GaN doped with Si. In this case, the above-described semiconductor light emitting devices can be semiconductor light emitting devices without an active layer.

On the other hand, referring to FIGS. 1 through 4, since the light emitting diode is very small, the display panel can be arranged with self-emitting sub-pixels arranged at fine pitch, thereby implementing a high-quality display device.

In a display device using the semiconductor light emitting device of the present disclosure described above, a semiconductor light emitting device grown on a wafer and formed through mesa and isolation is used as an individual pixel. In this case, the micro-sized semiconductor light emitting device 150 must be transferred to a wafer at a predetermined position on the substrate of the display panel. Pick and place is used for the transfer technology, but the success rate is low and a lot of time is required. For another example, there is a technology of transferring a plurality of devices at one time using a stamp or a roll, but the yield is limited and not suitable for a large screen display. The present disclosure proposes a new fabrication method of a display device capable of solving the foregoing problems and a fabrication device using the same.

For this purpose, first, a new fabrication method of the display device will be described. FIGS. 5A through 5G are views for explaining a new process of fabricating the foregoing semiconductor light emitting device.

In this specification, a display device using a passive matrix (PM) semiconductor light emitting device is illustrated. However, an example described below can also be applicable to an active matrix (AM) type semiconductor light emitting device. In addition, a method using a horizontal semiconductor light emitting device is illustrated, but it is also applicable to a method of self-assembling a vertical semiconductor light emitting device.

First, according to a manufacturing method, a first conductive semiconductor layer 153, an active layer 154, and a second conductive semiconductor layer 155 are respectively grown on a growth substrate 159.

Figure 5A:
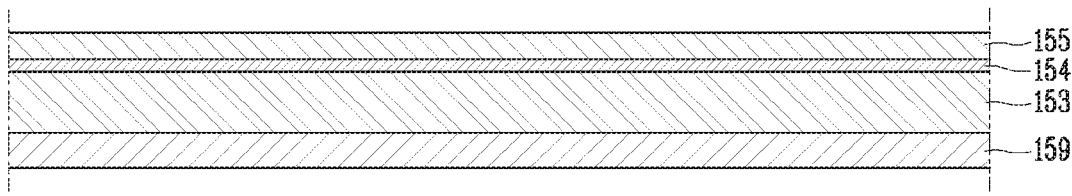
FIGS. 5A through 5G are views for explaining a new process of fabricating the foregoing semiconductor light emitting device.

When the first conductive semiconductor layer 153 is grown, next, the active layer 154 is grown on the first conductive semiconductor layer 153, and then the second conductive semiconductor layer 155 is grown on the active layer 154. As described above, when the first conductive semiconductor layer 153, the active layer 154 and the second conductive semiconductor layer 155 are sequentially grown, the first conductive semiconductor layer 153, the active layer 154, and the second conductive semiconductor layer 155 form a layer structure as illustrated in FIG. 5A.

In this case, the first conductive semiconductor layer 153 can be an n-type semiconductor layer, and the second conductive semiconductor layer 155 can be a p-type semiconductor layer. However, the present disclosure is not limited thereto, and the first conductive type can be p-type and the second conductive type can be n-type.

In addition, the present embodiment illustrates a case where the active layer is present, but it is also possible to adopt a structure in which the active layer is not present as described above. For such an example, the p-type semiconductor layer can be p-type GaN doped with Mg, and an n-electrode side in the n-type semiconductor layer can be n-type GaN doped with Si.

The growth substrate 159 (wafer) can be formed of any one of materials having light transmission properties, for example, sapphire (Al2O3), GaN, ZnO, and AlO, but is not limited thereto. Furthermore, the growth substrate 159 can be formed of a carrier wafer, which is a material suitable for semiconductor material growth. The growth substrate (W) can be formed of a material having an excellent thermal conductivity, and for example, a SiC substrate having a higher thermal conductivity than a sapphire (Al2O3) substrate or a SiC substrate including at least one of Si, GaAs, GaP, InP and Ga2O3 can be used.

Figure 5B:
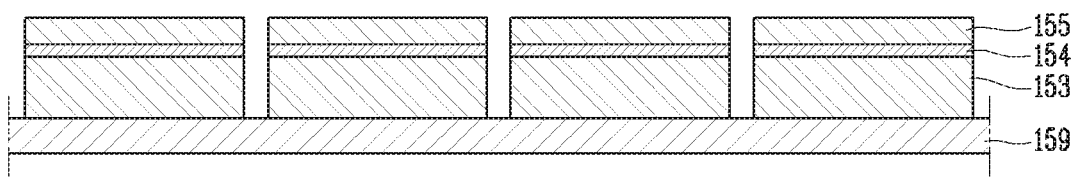

Next, at least part of the first conductive semiconductor layer 153, the active layer 154 and the second conductive semiconductor layer 155 is removed to form a plurality of epi chips of the semiconductor light emitting devices (FIG. 5B).

Figure 5C:
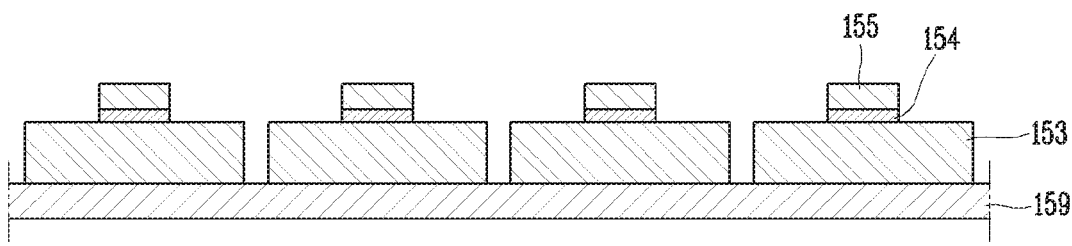

More specifically, isolation is carried out so that a plurality of light emitting devices form an array with epi chips. In other words, the first conductive semiconductor layer 153, the active layer 154, and the second conductive semiconductor layer 155 are etched in a vertical direction to form a plurality of semiconductor light emitting devices (FIG. 5C).

At this stage, the active layer 154 and the second conductive semiconductor layer 155 can be partially removed in a vertical direction to perform a mesa process in which the first conductive semiconductor layer 153 is exposed to the outside, and then isolation in which the first conductive semiconductor layer is etched to form a plurality of semiconductor light emitting device arrays. In this case, the semiconductor light emitting device can be isolated to a circular size of 100 μm or less in diameter.

Figure 5D:
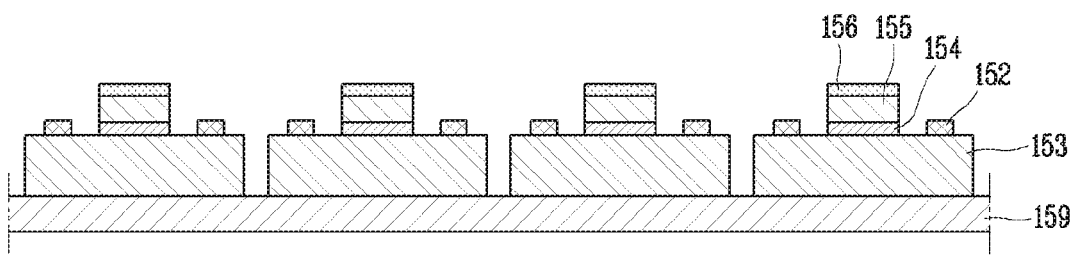

Next, a second conductive electrode 156 (or a p-type electrode) is formed on one surface of the second conductive semiconductor layer 155 (FIG. 5D). The second conductive electrode 156 can be formed by a deposition process such as sputtering, but the present disclosure is not necessarily limited thereto. However, when the first conductive semiconductor layer and the second conductive semiconductor layer are an n-type semiconductor layer and a p-type semiconductor layer, respectively, the second conductive electrode 156 can also be an n-type electrode.

Figure 5E:
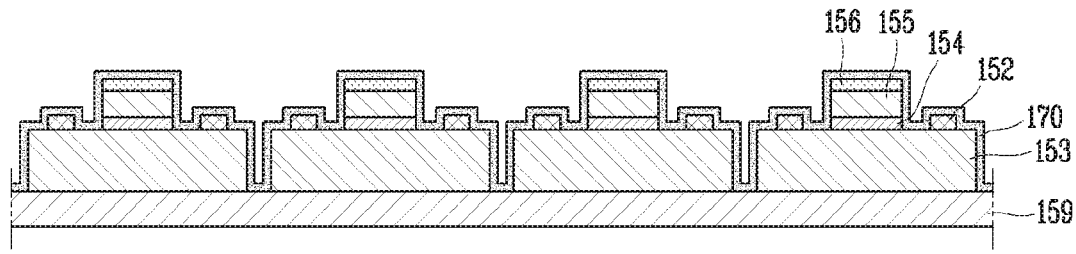

Next, a passivation layer 170 covering side and upper surfaces of the semiconductor light emitting device is formed (FIG. 5E).

Here, the passivation layer can be a polymer type or an inorganic type (e.g., $SiO_2$), but is not limited thereto. Meanwhile, the passivation layer 170 can be formed of the same material as a passivation layer formed on the side and upper surfaces of the semiconductor light emitting device.

The passivation layer 170 is formed to cover the first conductive semiconductor layer or the second conductive semiconductor layer 153, 155 exposed to the outside, and formed to cover the first and second conductive electrodes 152, 156 exposed to the outside. Accordingly, the passivation layer 170 can be formed to cover an entire upper surface of the semiconductor light emitting device. However, the present disclosure is not limited thereto, and the passivation layer can be formed to cover only part of an upper surface of the semiconductor light emitting device.

Figure 5F:
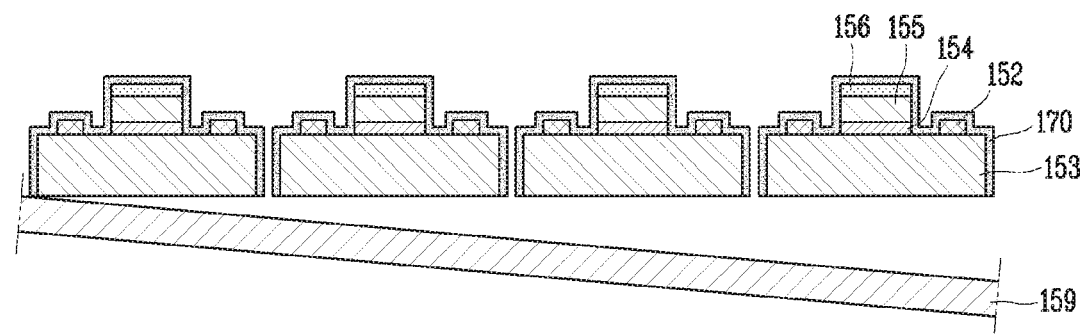

Then, the growth substrate 159 is removed to provide a plurality of semiconductor light emitting devices 250. For example, the growth substrate 159 can be removed using a laser lift-off (LLO) or chemical lift-off (CLO) method (FIG. 5F).

Figure 5G:
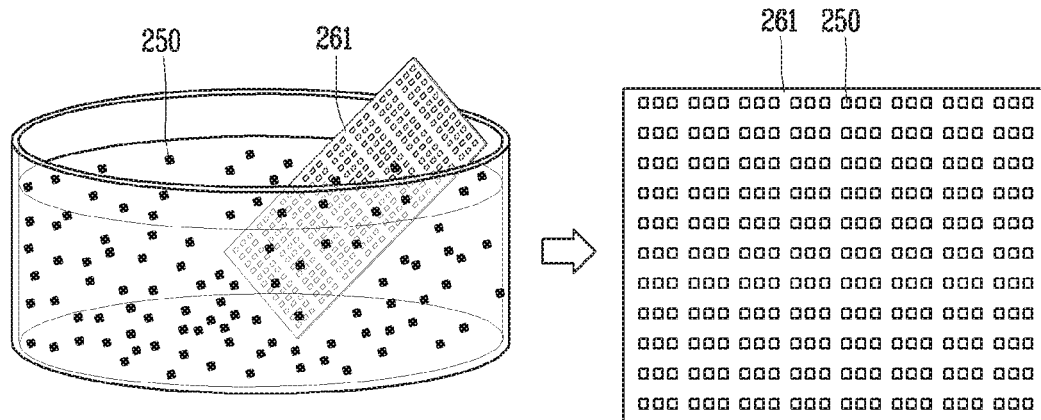

The passivation layer 170 is present on the upper and side surfaces of the semiconductor light emitting device that has been released through the above process. Then, the process of mounting the plurality of semiconductor light emitting devices 250 on the substrate in a chamber filled with a fluid (FIG. 5G).

For example, the semiconductor light emitting devices 250 and the substrate are placed in a chamber filled with a fluid, and the semiconductor light emitting devices 250 are assembled to the substrate by themselves using flow, gravity, surface tension, or the like.

In the present disclosure, the substrate can be a wiring substrate 261. In other words, the wiring substrate 261 is placed in the fluid chamber so that the semiconductor light emitting devices 250 are directly mounted on the wiring substrate 261.

Hereinafter, an embodiment for mounting the semiconductor light emitting devices 250 on the wiring substrate 261 will be described in detail with reference to the accompanying drawings.

Figure 6:
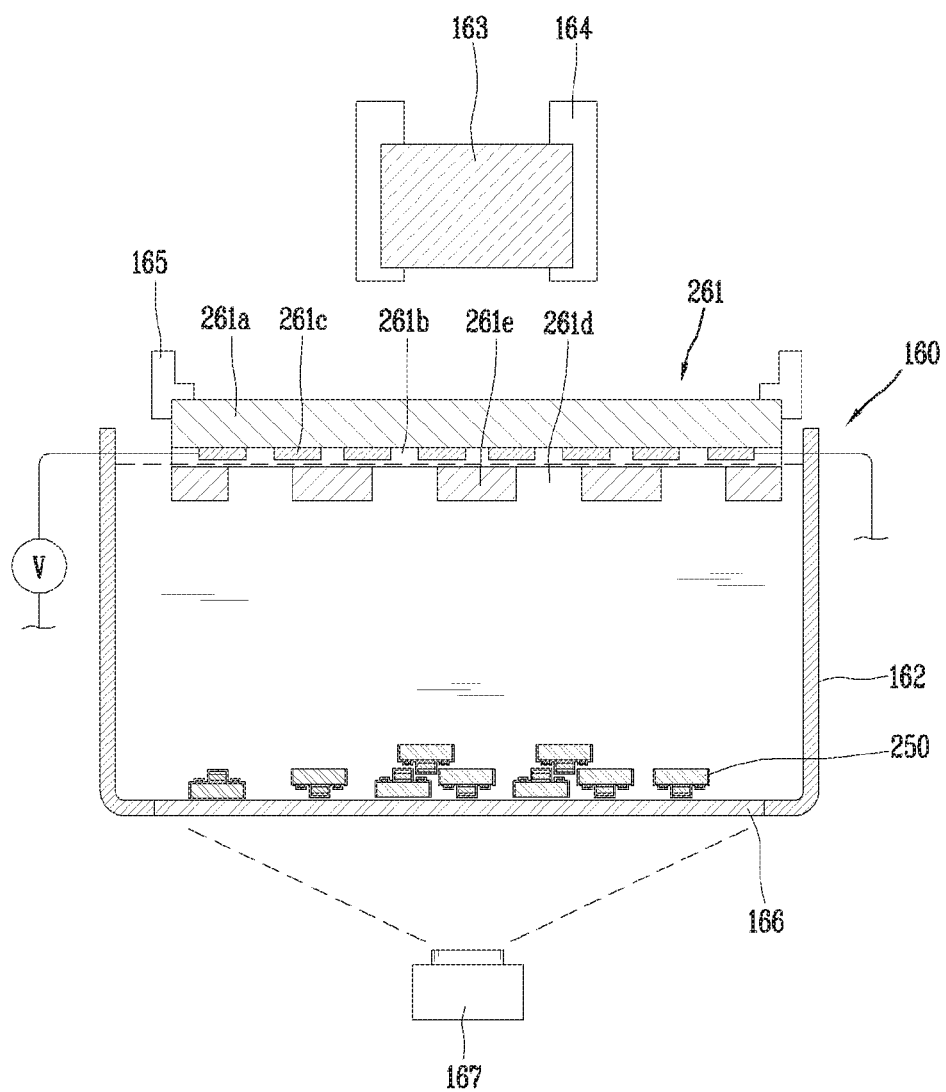
FIG. 6 is a view showing an example of a self-assembly device of semiconductor light emitting devices according to the present disclosure.
Figure 7:
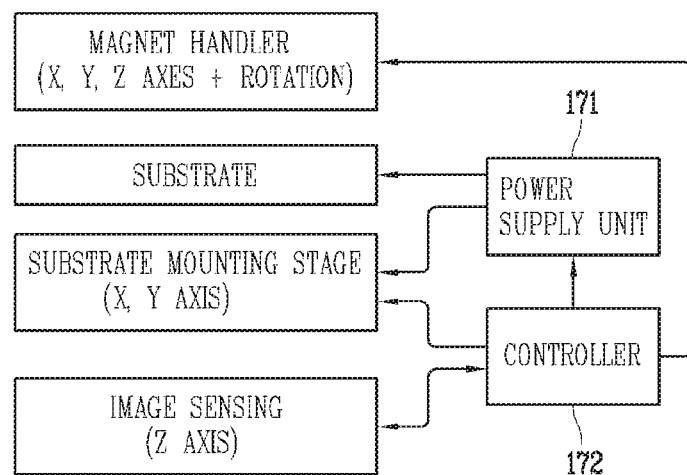
FIG. 7 is a block diagram showing the self-assembly device in FIG. 6.

FIG. 6 is a view showing an example of a self-assembly device of semiconductor light emitting devices according to the present invention, and FIG. 7 is a block diagram showing the self-assembly device in FIG. 6. Furthermore, FIGS. 8A through 8G are views showing a process of self-assembling semiconductor light emitting devices using the self-assembly device in FIG. 6.

According to the illustration of FIGS. 6 and 7, a self-assembly device 160 of the present disclosure can include a fluid chamber 162, a magnet 163, and a location controller 164.

The fluid chamber 162 has a space for accommodating a plurality of semiconductor light emitting devices. The space can be filled with a fluid, and the fluid can include water or the like as an assembly solution. Accordingly, the fluid chamber 162 can be a water tank, and can be configured with an open type. However, the present disclosure is not limited thereto, and the fluid chamber 162 can be a closed type in which the space is formed with a closed space.

The substrate 261 can be disposed on the fluid chamber 162 such that an assembly surface on which the semiconductor light emitting devices 250 are assembled faces downward. For example, the substrate 261 can be transferred to an assembly position by a transfer unit, and the transfer unit can include a stage 165 on which the substrate is mounted. The stage 165 is positioned by the controller, and the substrate 261 can be transferred to the assembly position through the stage 165.

At this time, the assembly surface of the substrate 261 faces the bottom of the fluid chamber 162 at the assembly position. According to the illustration, the assembly surface of the substrate 261 is disposed so as to be immersed in a fluid in the fluid chamber 162. Therefore, the semiconductor light emitting devices 250 are moved to the assembly surface in the fluid.

The substrate 261, which is an assembly substrate on which an electric field can be formed as well as a wiring substrate on which wiring lines are formed afterward, can include a base portion 261a, a dielectric layer 261b and a plurality of electrodes 261c, 261d.

The base portion 261a can be made of an insulating material, and the plurality of electrodes 261c can be a thin or a thick film bi-planar electrode patterned on one side of the base portion 261a. The electrode 261c can be formed of, for example, a laminate of Ti/Cu/Ti, an Ag paste, ITO, and the like.

More specifically, the electrode 261c can be a plurality of pair electrodes disposed on the substrate and provided with a first electrode 261c and a second electrode 261d that generate an electric field when an electric current is supplied.

The dielectric layer 261b is made of an inorganic material such as $SiO_2$, SiNx, SiON, $Al_2O_3$, $TiO_2$, $HfO_2$, or the like. Alternatively, the dielectric layer 261b can be composed of a single layer or multiple layers as an organic insulator. A thickness of the dielectric layer 261b can be several tens of nanometers to several micrometers.

Furthermore, the wiring substrate 261 according to the present disclosure includes a plurality of cells 261d partitioned by partition walls.

For example, the wiring substrate 261 can be provided with cells 261d through which the semiconductor light emitting devices 250 are inserted so that the semiconductor light emitting devices 250 can easily be mounted on the wiring substrate 261 Specifically, cells 261d on which the semiconductor light emitting devices 250 are mounted are formed on the wiring substrate 261 at positions where the semiconductor light emitting devices 250 are aligned with the wiring electrodes. The semiconductor light emitting devices 250 are assembled into the cells 261d while moving in the fluid.

The cells 261d are sequentially arranged along one direction, and the partition walls 261e constituting the cells 261d are shared with the neighboring cells 261d. In this case, the partition walls 261e can be made of a polymer material. Furthermore, the partition walls 261e are protruded from the base portion 261a, and the cells 261d can be sequentially arranged along the one direction by the partition walls 261e. More specifically, the cells 261d are sequentially arranged in row and column directions, and can have a matrix structure.

As shown in the drawing, an inside of the cells 261d has a groove for accommodating the semiconductor light emitting device 250, and the groove can be a space defined by the partition walls 261e. The shape of the groove can be the same as or similar to that of the semiconductor light emitting device. For example, when the semiconductor light emitting device is in a rectangular shape, the groove can be a rectangular shape. In addition, although not shown, when the semiconductor light emitting device is circular, the grooves formed in the cells can be formed in a circular shape. Moreover, each of the cells is configured to accommodate a single semiconductor light emitting device. In other words, a single semiconductor light emitting device is accommodated in a single cell.

On the other hand, according to the present disclosure, a material same as that of the partition walls 261e can be filled inside the cells 261d by a subsequent process. Accordingly, the partition walls 261e can be modified into a passivation layer surrounding the semiconductor light emitting devices. This will be described later.

On the other hand, a plurality of electrodes can be disposed on the substrate, and have a first electrode and a second electrode that generate an electric field when an electric current is supplied, and the first electrode and the second electrode can be referred to as a pair electrode 261c. In the present disclosure, a plurality of the pair electrodes 261c can be provided, and disposed at the bottom of each of the cells 261d. The first electrode and the second electrode can be formed of electrode lines, and the plurality of electrode lines can be extended to neighboring cells.

The pair electrodes 261c are disposed below the cells 261d and applied with different polarities to generate an electric field in the cells 261d. In order to form the electric field, the dielectric layer can form the bottom of the cells 261d while the dielectric layer covers the pair electrodes 261c. In such a structure, when different polarities are applied to the pair electrode 261c from a lower side of each cell 261d, an electric field can be formed, and the semiconductor light emitting device can be inserted into the cells 261d by the electric field.

At the assembly position, the electrodes of the substrate 261 are electrically connected to the power supply unit 171. The power supply unit 171 applies power to the plurality of electrodes to generate the electric field.

According to the illustration, the self-assembly device can include a magnet 163 for applying a magnetic force to the semiconductor light emitting devices. The magnet 163 is spaced apart from the fluid chamber 162 to apply a magnetic force to the semiconductor light emitting devices 250. The magnet 163 can be disposed to face an opposite side of the assembly surface of the substrate 261, and the location of the magnet is controlled by the location controller 164 connected to the magnet 163. The semiconductor light emitting device 250 can have a magnetic body so as to move in the fluid by the magnetic field of the magnet 163.

Referring to FIGS. 6 and 7, more specifically, the self-assembly device can include a magnet handler that can be automatically or manually moved in the x, y, and z axes on the top of the fluid chamber or include a motor capable of rotating the magnet 163. The magnet handler and the motor can constitute the location controller 164. Through this, the magnet 163 rotates in a horizontal direction, a clockwise direction, or a counterclockwise direction with respect to the substrate 161.

On the other hand, a light transmitting bottom plate 166 can be formed in the fluid chamber 162, and the semiconductor light emitting devices can be disposed between the bottom plate 166 and the substrate 161. An image sensor 167 can be positioned to view the bottom plate 166 so as to monitor an inside of the fluid chamber 162 through the bottom plate 166. The image sensor 167 is controlled by the controller 172, and can include an inverted type lens, a CCD, and the like to observe the assembly surface of the substrate 261.

The self-assembling apparatus described above is configured to use a combination of a magnetic field and an electric field, and using those fields, the semiconductor light emitting devices can be placed at preset positions of the substrate by an electric field in the process of being moved by a location change of the magnet. Such a new fabrication method can be a detailed example of the self-assembly method described above with reference to FIG. 5E. Hereinafter, an assembly process using the self-assembly device described above will be described in more detail.

First, a plurality of semiconductor light emitting devices 250 are formed through the process described with reference to FIGS. 5A through 5G. In this case, a magnetic body can be deposited on the semiconductor light emitting device in the process of forming the second conductive electrode in FIG. 5C. The magnetic body can control the movement of the semiconductor light emitting device by the magnet 163.

Figure 8A:
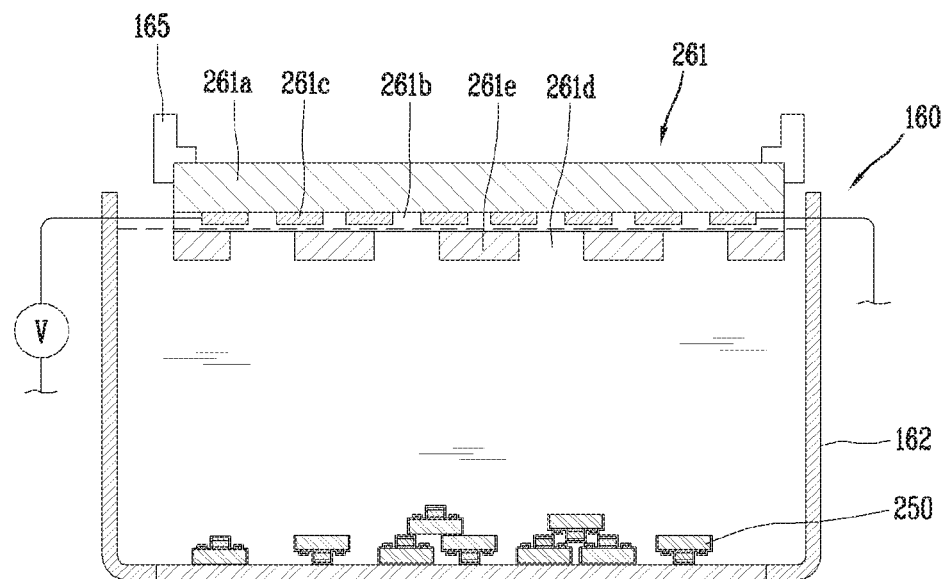
FIGS. 8A through 8G are views showing a process of self-assembling semiconductor light emitting devices using the self-assembly device in FIG. 6.

Next, the substrate 261 is transferred to the assembly position, and the semiconductor light emitting devices 250 are put into the fluid chamber 162 (FIG. 8A).

As described above, the assembly position of the substrate 261 is a position at which the assembly surface on which the semiconductor light emitting devices 250 of the substrate 261 are assembled is disposed in a downward direction in the fluid chamber 162.

In this case, some of the semiconductor light emitting devices 250 can sink to the bottom of the fluid chamber 162 and some can float in the fluid. When the light transmitting bottom plate 166 is provided in the fluid chamber 162, some of the semiconductor light-emitting devices 250 can sink to the bottom plate 166.

Figure 8B:
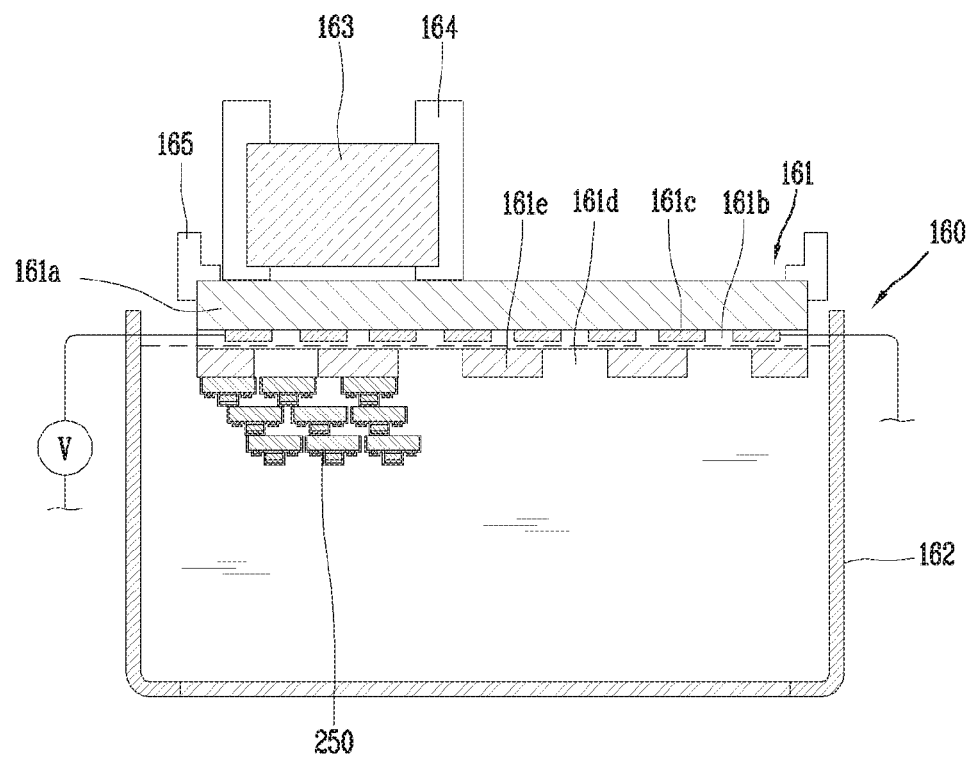

Next, a magnetic force is applied to the semiconductor light emitting devices 250 so that the semiconductor light emitting devices 250 float in the fluid chamber 162 in a vertical direction (FIG. 8B).

When the magnet 163 of the self-assembly device moves from its original position to an opposite side of the assembly surface of the substrate 261, the semiconductor light emitting devices 250 float in the fluid toward the substrate 261. The original position can be a position away from the fluid chamber 162. For another example, the magnet 163 can be composed of an electromagnet. In this case, electricity is supplied to the electromagnet to generate an initial magnetic force.

Meanwhile, in this example, a separation distance between the assembly surface of the substrate 261 and the semiconductor light emitting devices 250 can be controlled by adjusting the magnitude of the magnetic force. For example, the separation distance is controlled using the weight, buoyancy, and magnetic force of the semiconductor light emitting devices 250. The separation distance can be several millimeters to tens of micrometers from the outermost edge of the substrate.

Figure 8C:
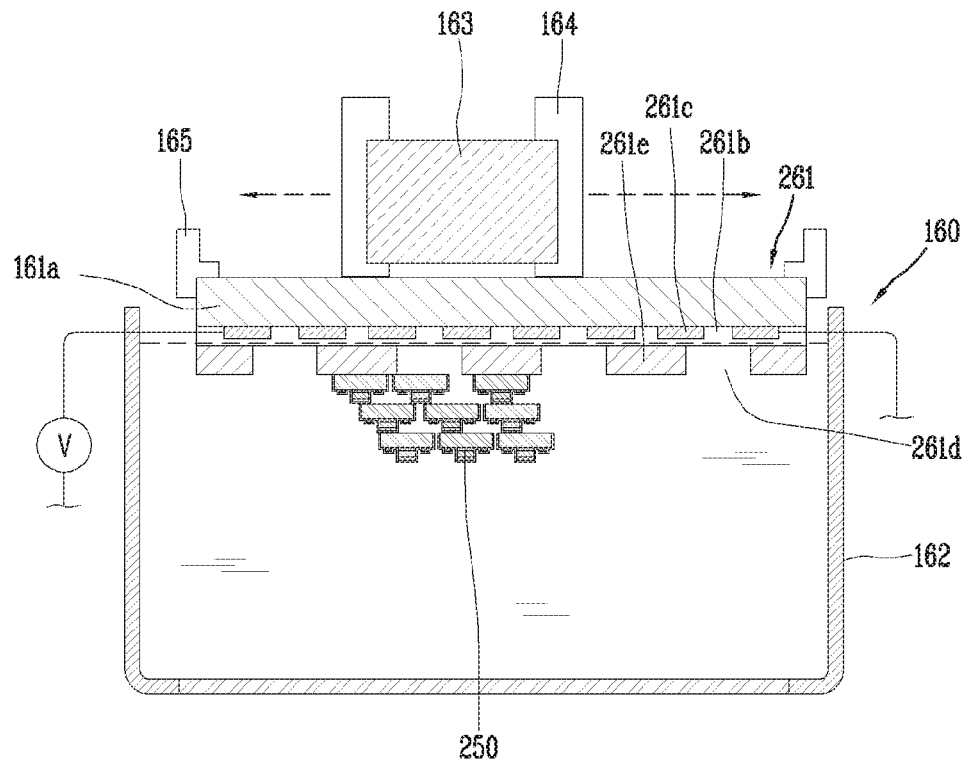

Next, a magnetic force is applied to the semiconductor light emitting devices 250 so that the semiconductor light emitting devices 250 move in one direction in the fluid chamber 162. For example, the magnet 163 moves in a horizontal direction, a clockwise direction or a counterclockwise direction with respect to the substrate (FIG. 8C). In this case, the semiconductor light emitting devices 250 move in a direction parallel to the substrate 161 at a position spaced apart from the substrate 161 by the magnetic force.

Figure 8D:
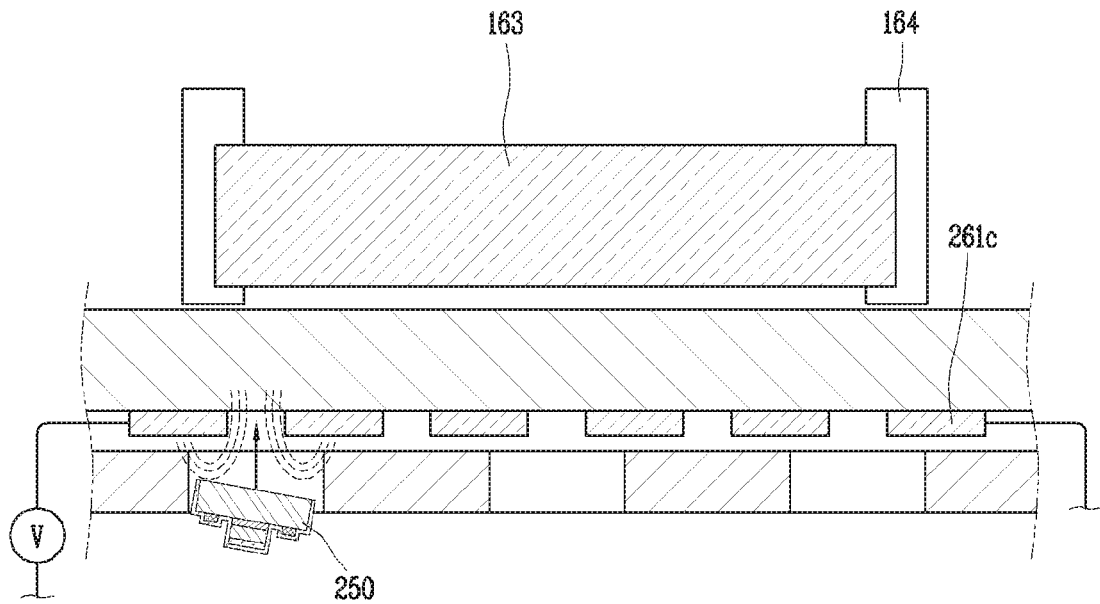

Next, the process of applying an electric field to guide the semiconductor light emitting devices 250 to preset positions of the substrate 161 so as to allow the semiconductor light emitting devices 250 to be placed at the preset positions during the movement of the semiconductor light emitting devices 250 is carried out (FIG. 8D). The semiconductor light emitting devices 250 move in a direction perpendicular to the substrate 261 by the electric field to be placed on preset positions while moving along a direction parallel to the substrate 161.

The plurality of semiconductor light emitting devices are guided to preset positions of the substrate by an electric field and a magnetic field.

More specifically, electric power is supplied to a pair electrode, that is, a bi-planar electrode of the substrate 261 to generate an electric field, and assembly is carried out only at preset positions. In other words, the semiconductor light emitting devices 250 are assembled to the assembly position of the substrate 261 using a selectively generated electric field. For this purpose, the substrate 261 can include cells in which the semiconductor light emitting devices 250 are inserted.

At this time, the magnetic body of the semiconductor light emitting devices 250 serves as a post for upper and lower division. Specifically, when a surface having the magnetic body is inserted into the cell in a direction toward the pair electrode 261c, the semiconductor light emitting device is unable to be placed on the bottom of the cell (an outer surface of the dielectric layer) by the magnetic body.

Figure 8E:
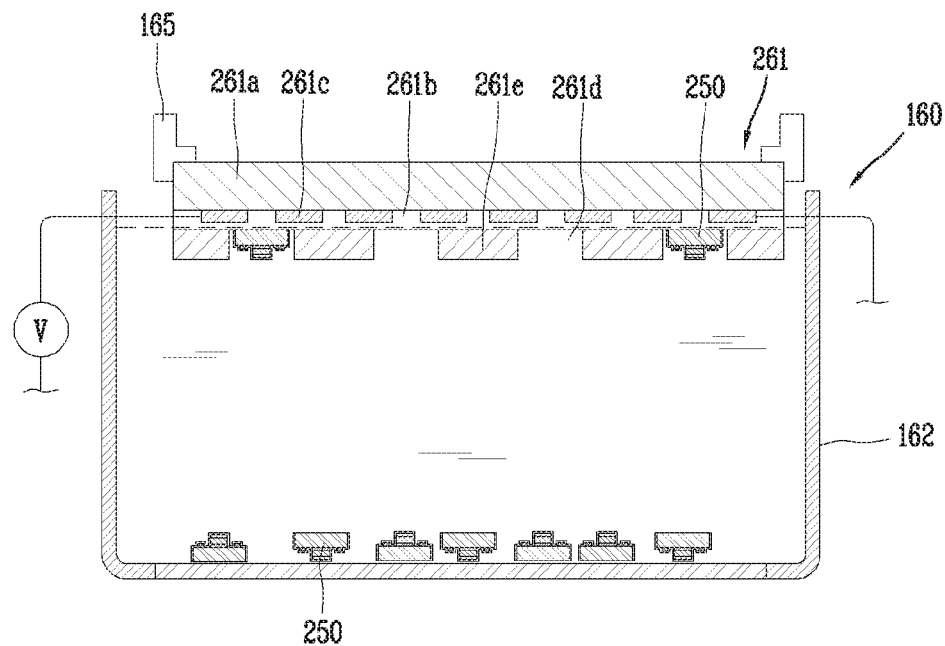

On the other hand, the semiconductor light emitting devices 250 can be guided to the preset positions, then the magnet 163 can move in a direction away from the substrate 261 such that the semiconductor light emitting devices 250 remaining in the fluid chambers 162 fall to the bottom of the fluid chambers 162, (FIG. 8E). For another example, if power supply is stopped when the magnet 163 is an electromagnet, then the semiconductor light emitting devices 250 remaining in the fluid chamber 162 fall to the bottom of the fluid chamber 162.

Then, when the semiconductor light emitting devices 250 on the bottom of the fluid chamber 162 are collected, the collected semiconductor light emitting devices 250 can be reused.

When the display device of the present disclosure uses blue semiconductor light emitting devices, that is, when the semiconductor light emitting devices are all blue semiconductor light emitting devices, the blue semiconductor light emitting devices can be assembled into all the cells of the substrate.

On the other hand, according to this example, each of the red semiconductor light emitting device, the green semiconductor light emitting device, and the blue semiconductor light emitting device can be arranged at a desired position. If the foregoing semiconductor light emitting device 250 is a blue semiconductor light emitting device, the assembly process described with reference to FIGS. 8A through 8E can generate an electric field only in a cell corresponding to a blue pixel to assemble the blue semiconductor light emitting device at a corresponding position.

Figure 8F:
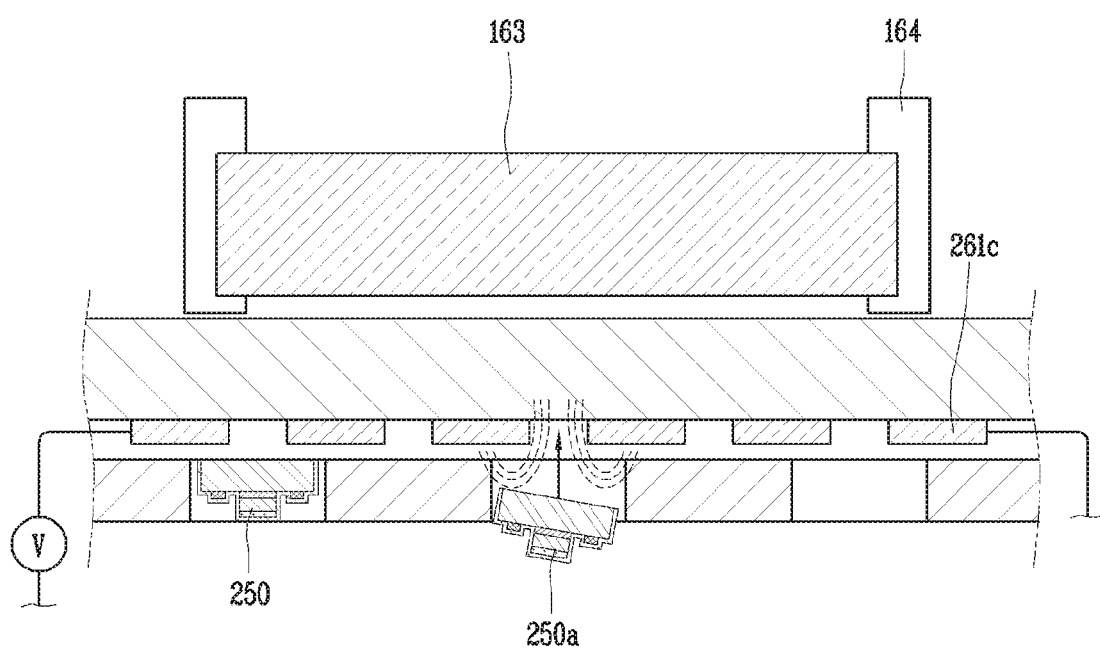
Figure 8G:
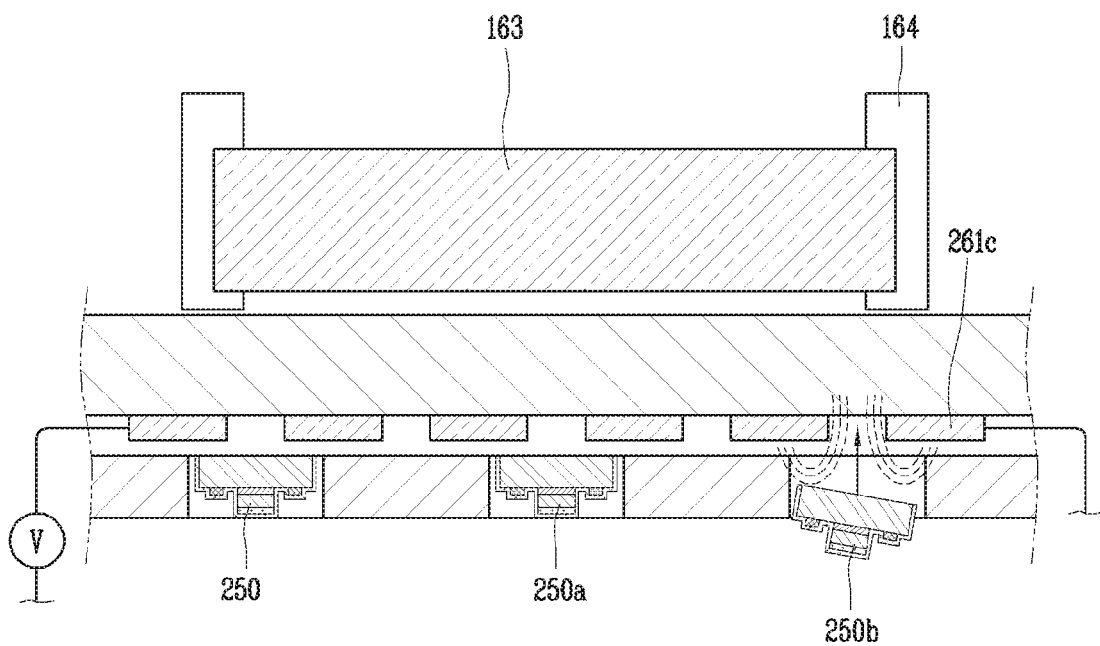

Then, the assembly process described with reference to 8A through 8E are carried out using the green semiconductor light emitting device 250a and the red semiconductor light emitting device 250b, respectively (FIGS. 8F and 8G). However, since the wiring substrate 261 is already loaded at the assembly position, the process of loading the substrate into the assembly position can be omitted.

Then, the process of unloading the wiring substrate 261 is carried out, and the assembly process is completed.

The above-described self-assembly device and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. In other words, in order to increase the transfer yield, the assembly substrate is placed on the top to minimize the effect of a gravitational or frictional force, and prevent nonspecific coupling.

Meanwhile, in order to minimize non-specific coupling of the semiconductor light emitting device, the semiconductor light emitting device can have a structure symmetrically formed with respect to a width direction of the semiconductor light emitting device.

Furthermore, the blue semiconductor light emitting device, the green semiconductor light emitting device, and the red semiconductor light emitting device can be assembled at desired positions, respectively.

As described above, according to the present disclosure having the foregoing configuration, a large number of semiconductor light emitting devices can be assembled at one time in a display device in which individual pixels are formed with semiconductor light emitting devices.

When the assembly process is completed as described above, a process of fabricating a display device can be carried out. Hereinafter, a fabrication process of such a display device will be described in detail with reference to the drawings.

Figure 9A:
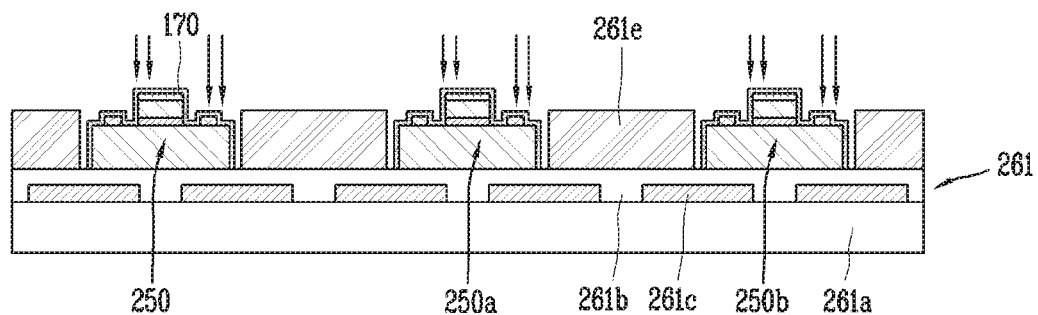
FIGS. 9A through 9C are views showing a process of fabricating a display device after self-assembling semiconductor light emitting devices on a wiring substrate using the self-assembly device in FIG. 6.
Figure 9B:
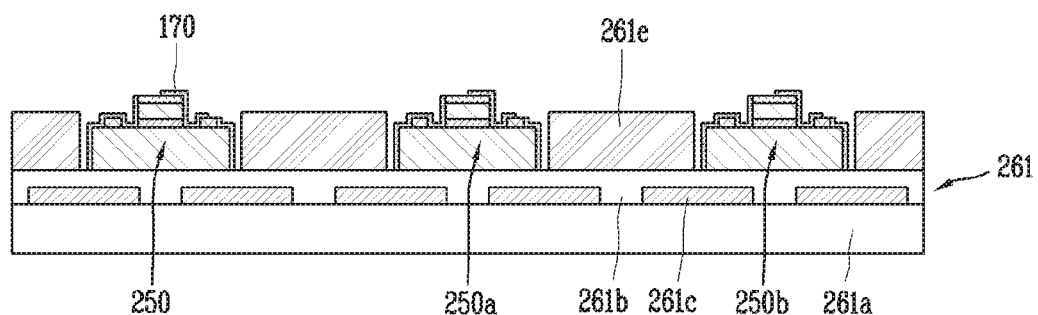
Figure 9C:
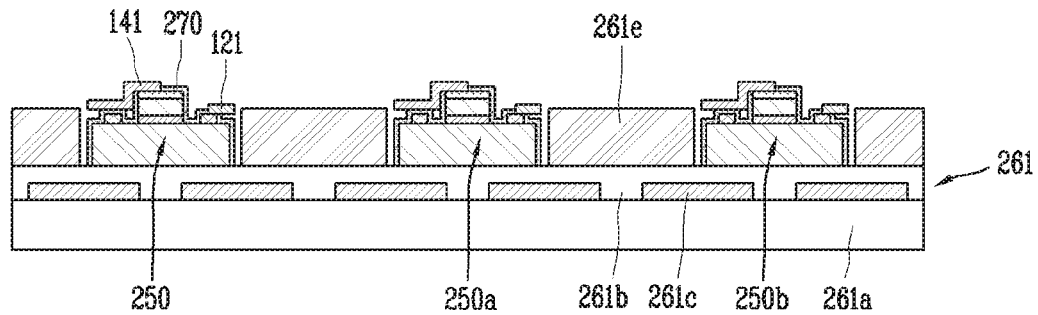

FIGS. 9A through 9C are views showing a process of fabricating a display device after self-assembling semiconductor light emitting devices on a wiring substrate using the self-assembly device in FIG. 6.

The movement of the semiconductor light emitting devices in the fluid chamber are guided, and the semiconductor light emitting devices are assembled at preset positions of the substrate by the foregoing process, and then the second conductive electrodes 252, 256 are exposed to the outside while the semiconductor light emitting devices 250, 250a, 250b are assembled at the preset positions of the substrate 261.

To this end, the process of etching part of the passivation layer overlapping with the first and second conductive electrodes 252, 256 is carried out (FIG. 9A). In this process, the passivation layer 170 is etched only at a portion where the wiring electrodes and the first and second conductive electrodes are to be removed for electrical connection. Therefore, a portion that is not connected to the wiring electrode on the entire region of the passivation layer is not etched. In particular, in the etching process, the entire region of the first and second conductive electrodes 252, 256 is not exposed to the outside, but only part of the first and second conductive electrodes 252, 256 connected to the wiring electrode is exposed to the outside (FIG. 9B).

Then, the process of connecting the first and second wiring electrodes to the first and second conductive electrodes is carried out (FIG. 9C). In this process, the second wiring electrode is inevitably overlapped with the first conductive electrode. Specifically, since the first conductive electrode is disposed so as to surround the second conductive electrode, in order to electrically connect the second wiring electrode to the second conductive electrode, the second wiring electrode is inevitably overlapped with the first conductive electrode.

However, since most of the passivation layer covering the first conductive electrode is not removed in the etching process, part of the second wiring electrode can be disposed to overlap with part of the first conductive electrode with the passivation layer interposed therebetween. The passivation layer prevents the first conductive electrode and the second wiring electrode from being electrically connected to each other.

According to the fabrication method described above, since the passivation layer covering most of the semiconductor light emitting device is formed from the fabrication of the semiconductor light emitting device, it is not required to form an additional passivation layer subsequent to transferring the semiconductor light emitting device.

In addition, according to the present disclosure, it is not required to perform the process of exposing the conductive electrode of the semiconductor light emitting device to the outside in the fabrication process of the semiconductor light emitting device. As a result, the number of processes is reduced, and the process error is reduced. Moreover, the size of the semiconductor light emitting device can be reduced due to the reduction in the process error.

Furthermore, when the processes of FIGS. 8A through 8G are carried out subsequent to exposing part of the conductive electrode to the outside in the fabrication process of the semiconductor light emitting device, positions where the conductive electrodes are exposed are different for each semiconductor light emitting device. When the conductive electrode is irregularly exposed to the outside, it is difficult to connect the wiring electrode to the conductive electrode. According to the present disclosure, since the conductive electrode is exposed to the outside subsequent to transferring the semiconductor light emitting device, the position of the conductive electrode exposed to the outside becomes uniform. Through this, the present disclosure makes it possible to easily form the wiring electrode subsequent to the transfer of the semiconductor light emitting device.

Hereinafter, the structure of a display device formed through the processes described in FIGS. 9A to 9C will be described in more detail.

Figure 10A:
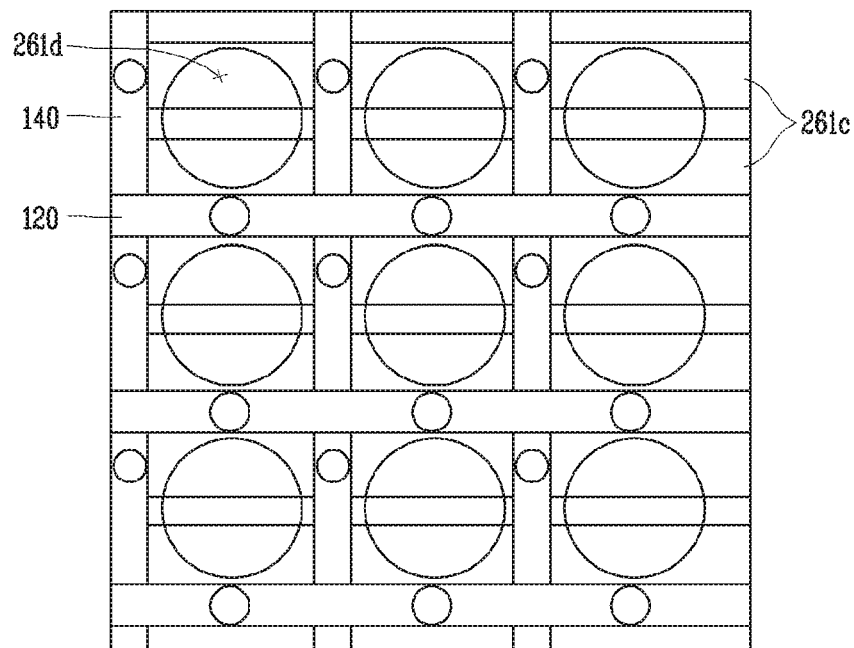
FIG. 10A is a plan view showing a wiring substrate prior to transferring semiconductor light emitting devices.
Figure 10B:
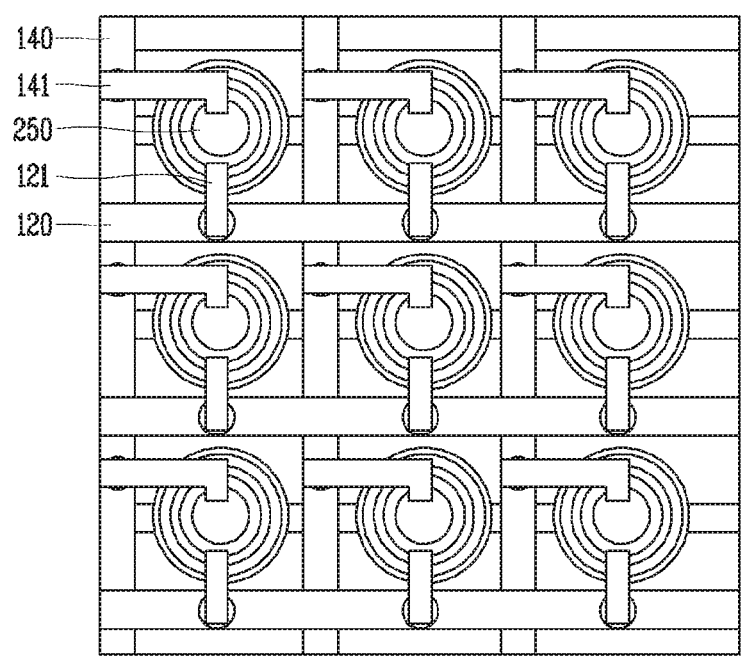
FIG. 10B is a plan view showing a wiring substrate subsequent to transferring semiconductor light emitting devices.

FIG. 10A is a plan view showing a wiring substrate prior to transferring semiconductor light emitting devices, and FIG. 10B is a plan view showing a wiring substrate subsequent to transferring semiconductor light emitting devices.

Referring to FIG. 10A, electrodes 261c for forming an electric field in the process described in FIGS. 8A through 8G, line electrodes 120, 140 for supplying an external power source to the semiconductor light emitting device, and holes to be placed at the designated positions can be formed on the wiring substrate.

FIG. 10B shows a structure in which the semiconductor light emitting devices 250 are placed on the wiring substrate and then the wiring electrodes are formed thereon. Referring to the drawing, the first conductive electrode and the second conductive electrode must be electrically connected to different line electrodes. A first wiring electrode 121 connected to a first line electrode 120 is electrically connected to the first conductive electrode 252, and a second wiring electrode 141 connected to a second line electrode 140 is electrically connected to the second conductive electrode 256.

The display device fabricated through the process of FIGS. 9A through 9C has the structure of FIG. 10B. Here, the structure of the display device varies depending on the structure of the semiconductor light emitting device.

FIGS. 11A through 12B are views showing various modified embodiments of a display device according to the present invention.

Referring to FIGS. 11A through 12B, the first conductive electrode 352 is formed in a ring shape on an upper edge of the semiconductor light emitting device, and the second conductive electrode 356 is formed at an upper central portion of the semiconductor light emitting device.

On the other hand, the passivation layer 170 is disposed to cover part of the side and upper surfaces of the semiconductor light emitting device. Specifically, the passivation layer 170 is disposed to cover an upper surface of the semiconductor light emitting device except part of the first and second conductive electrodes 352, 356 connected to the first and second wiring electrodes 121, 141. Since the passivation layer is formed on the side and upper surfaces of the semiconductor light emitting device through a single process, the passivation layer can be formed to extend from the side of the semiconductor light emitting device in a width direction of the semiconductor light emitting device and cover part of the first and second conductive electrodes.

On the other hand, the first and second wiring electrodes 121, 141 are extended from an edge of the semiconductor light emitting device in a central direction of the semiconductor light emitting device such that the first wiring electrode 121 is electrically connected to the first conductive electrode 352, and the second wiring electrode 141 is electrically connected to the second conductive electrode. Accordingly, the second wiring electrode 141 overlaps with the first conductive electrode with the passivation layer 170 interposed therebetween.

On the other hand, the first and second conductive electrodes can be disposed with a height difference with respect to a thickness direction of the semiconductor light emitting device.

Figure 11A:
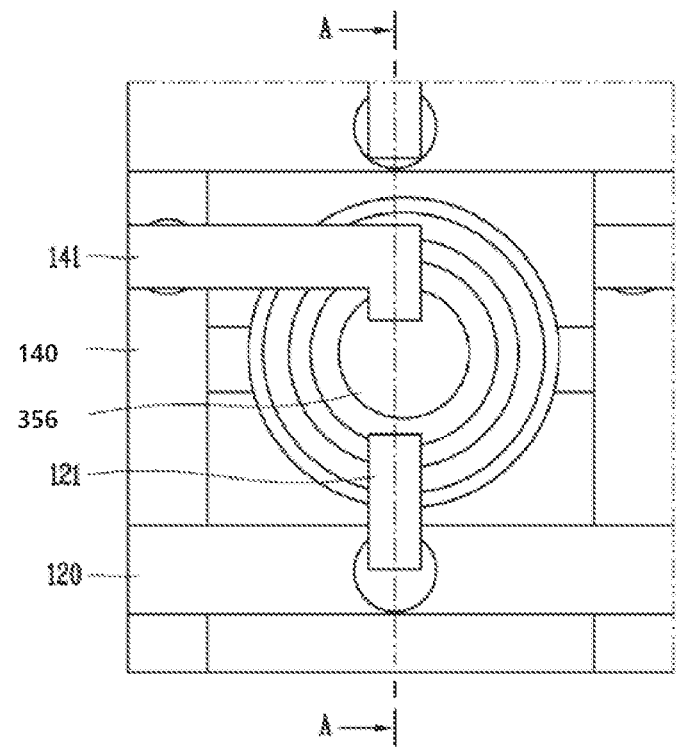
FIGS. 11A through 16 are views showing various modified embodiments of a display device according to the present disclosure.
Figure 11B:
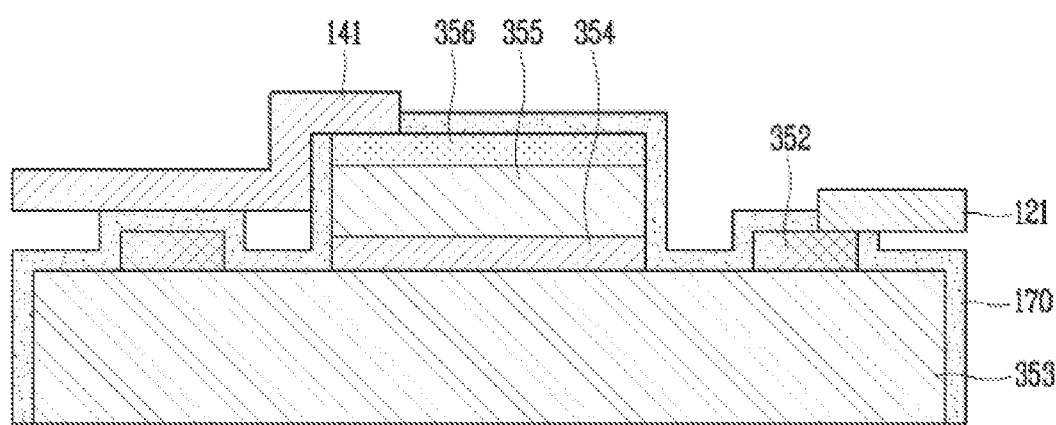

First, referring to FIGS. 11A and 11B, an embodiment in which the second conductive electrode is formed at a higher position than the first conductive electrode will be described. FIG. 11B is a cross-sectional view taken along line A-A in FIG. 11A.

The semiconductor light emitting device includes a first conductive semiconductor layer 353 disposed below the first conductive electrode 352, a second conductive semiconductor layer 355 disposed below the second conductive electrode 356, and an active layer 354 disposed between the first and second conductive semiconductor layers 353, 355.

Referring to FIG. 11B, the second conductive electrode 356 can be disposed at a position higher than the first conductive electrode 352. The active layer 354 is disposed to overlap with the second conductive electrode 356 disposed at a central portion of the semiconductor light emitting device. Since light is emitted from the active layer 354, light is emitted from the central portion of the semiconductor light emitting device in the structure shown in FIGS. 11A and 11B.

Figure 12A:
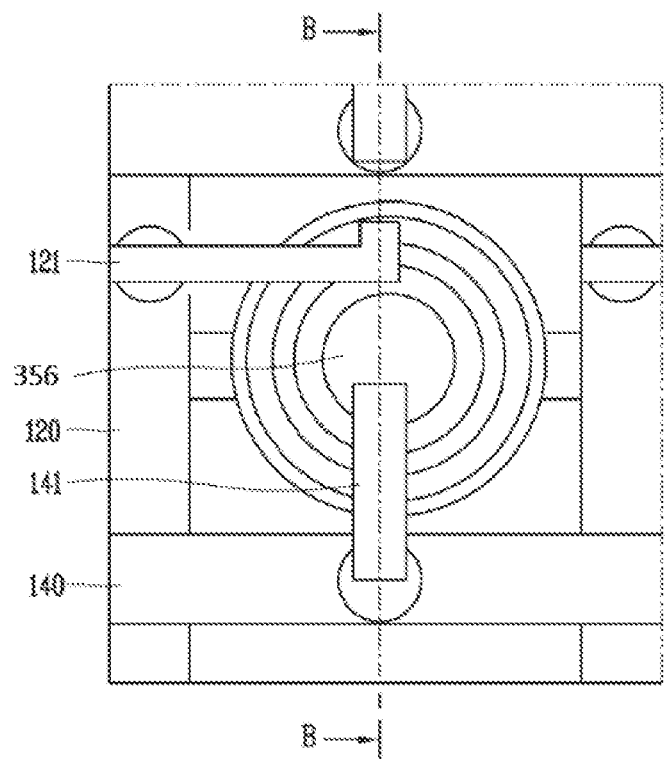
Figure 12B:
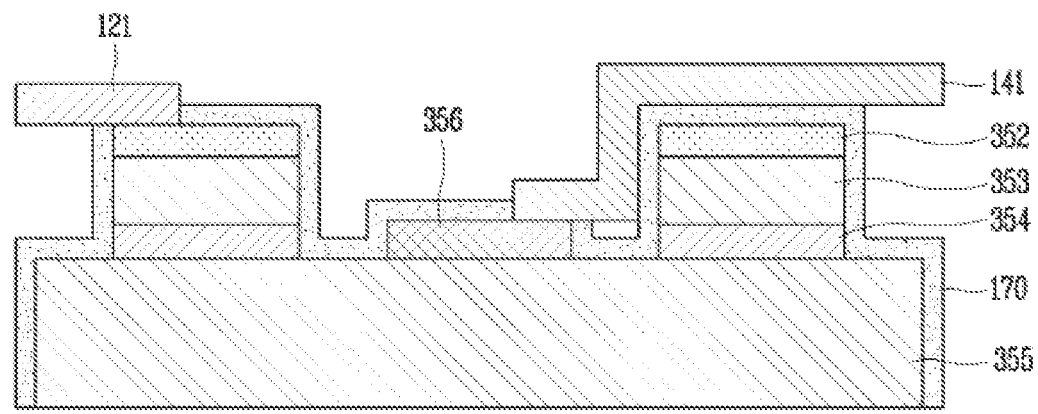

Next, referring to FIGS. 12A and 12B, an embodiment in which the first conductive electrode is formed at a higher position than the second conductive electrode will be described. FIG. 12B is a cross-sectional view taken along line B-B in FIG. 12A.

The semiconductor light emitting device includes a first conductive semiconductor layer 353 disposed below the first conductive electrode 352, a second conductive semiconductor layer 355 disposed below the second conductive electrode 356, and an active layer 354 disposed between the first and second conductive semiconductor layers 353, 355.

Referring to FIG. 12B, the first conductive electrode 352 can be disposed at a position higher than the second conductive electrode 356. The active layer 354 is formed in a ring shape to overlap with the first conductive electrode 352. In the structure shown in FIGS. 12A and 12B, a light emitting surface is formed in a ring shape.

On the other hand, a recess portion can be formed on the first and second conductive semiconductor layers, and the first and second conductive electrodes can be disposed in the recess portion.

Figure 13A:
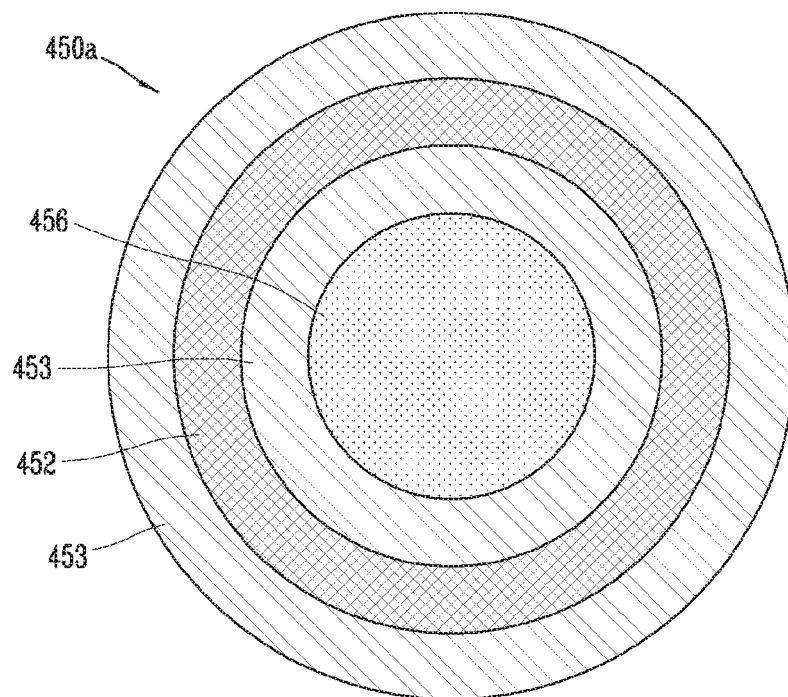
Figure 13B:
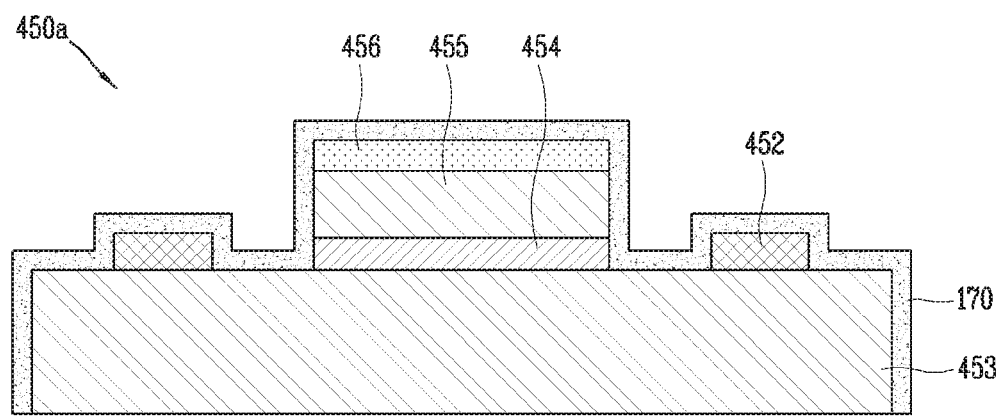

In one embodiment, referring to FIGS. 13A and 13B, a recess portion can be formed on the second conductive semiconductor layer 455, and a second conductive electrode 456 can be disposed in the recess portion. The structure described above can reduce a height difference between the conductive semiconductor layer and the conductive electrode so that the passivation layer 170 can be uniformly formed on an upper surface of the semiconductor light emitting device 450a, and afterwards the wiring electrode can be uniformly formed on an upper surface of the semiconductor light emitting device. The semiconductor light emitting device 450a includes a first conductive semiconductor layer 453 disposed below the first conductive electrode 452, a second conductive semiconductor layer 455 disposed below the second conductive electrode 456, and an active layer 454 disposed between the first and second conductive semiconductor layers 453, 455.

On the other hand, the shape of the semiconductor light emitting device according to the present disclosure is not limited to a circular shape.

Figure 14A:
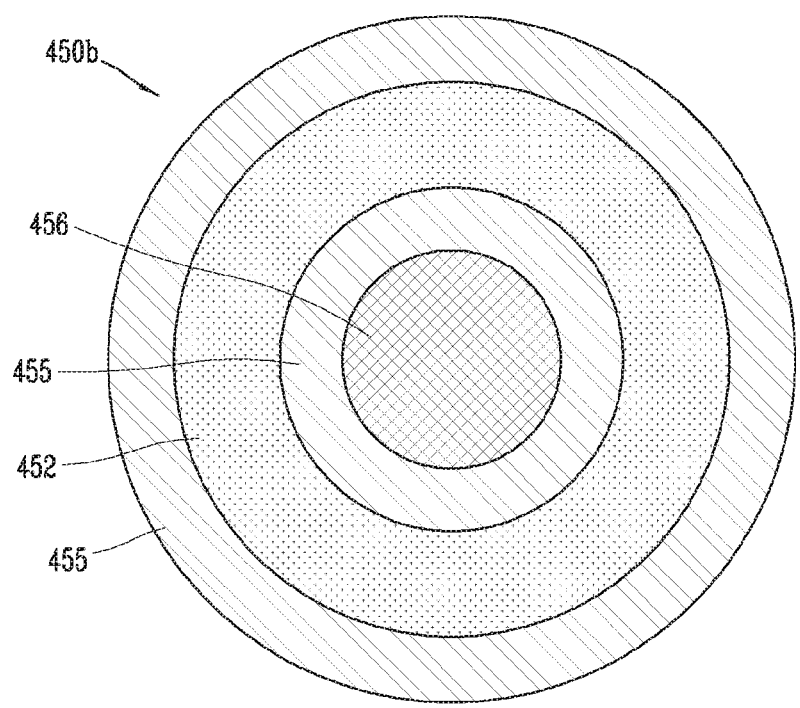
Figure 14B:
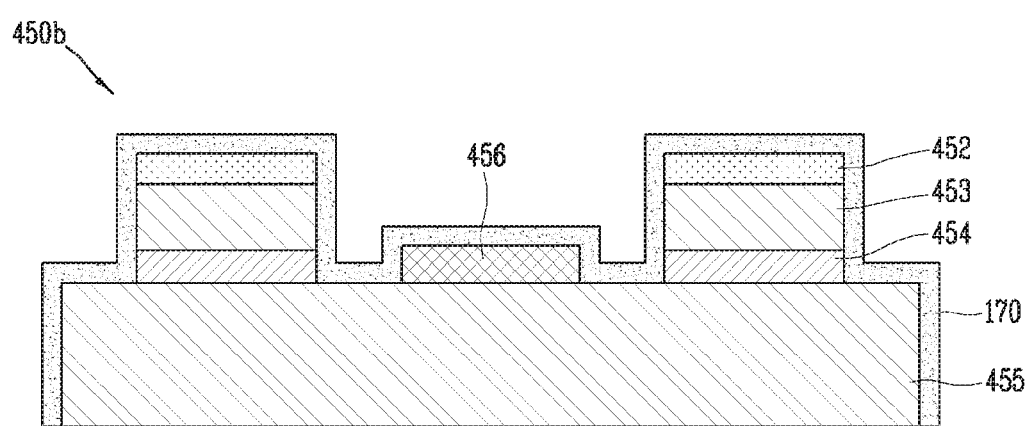

FIGS. 14A and 14B are views showing a different height difference between the conductive semiconductor layer and the conductive electrode so that the passivation layer can be uniformly formed on an upper surface of the semiconductor light emitting device 450b, and afterwards the wiring electrode can be uniformly formed on an upper surface of the semiconductor light emitting device.

Figure 15A:
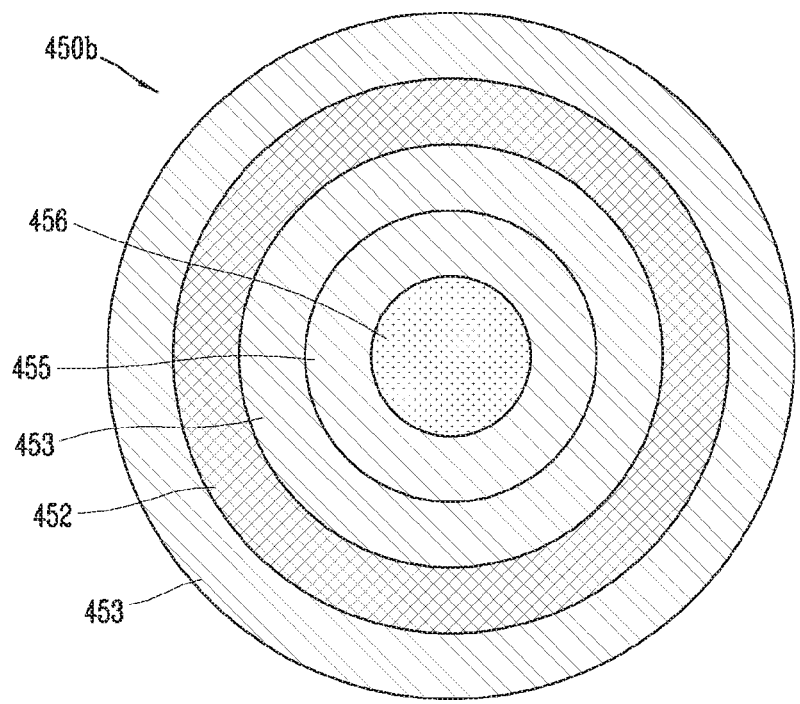
Figure 15B:
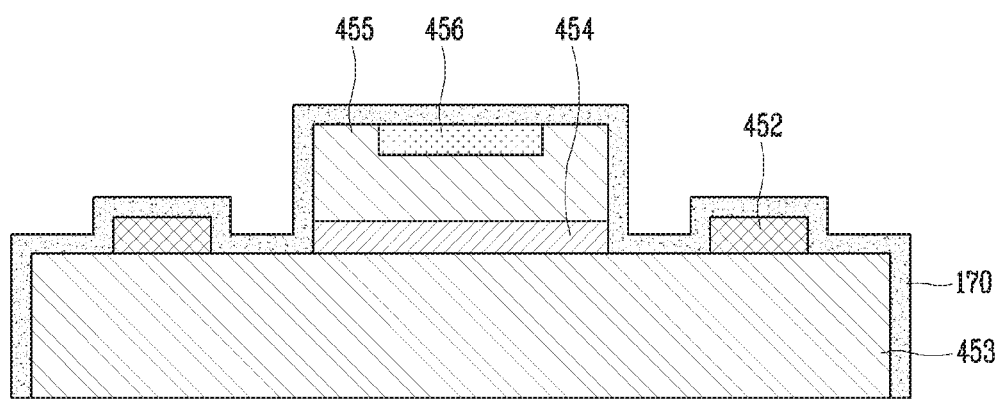

FIGS. 15A and 15B are views showing an area of second conductive electrode 456 of the semiconductor light emitting device 450b being formed smaller than an upper surface of the second conductive semiconductor layer 455 so that a portion of the second conductive semiconductor layer 455 is present at the upper surface thereof to contact the passivation layer 170.

Figure 16:
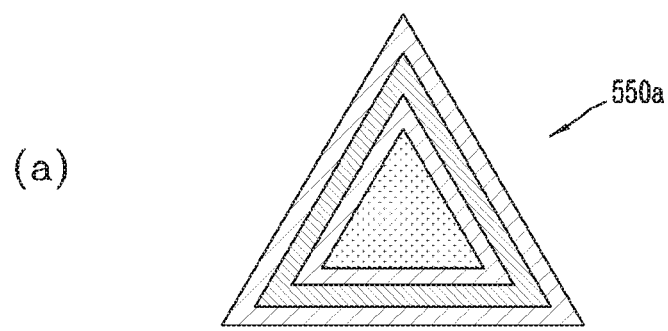
Figure 16:
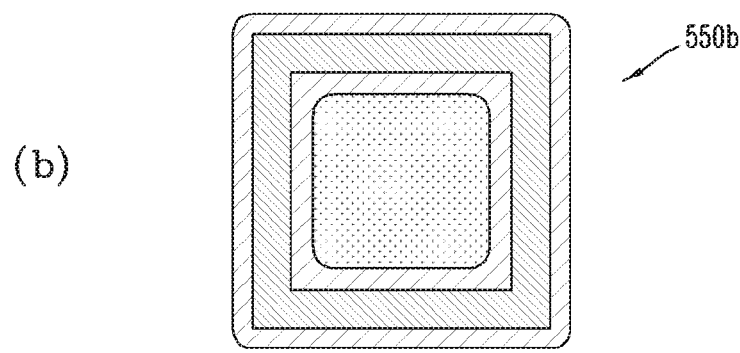
Figure 16:
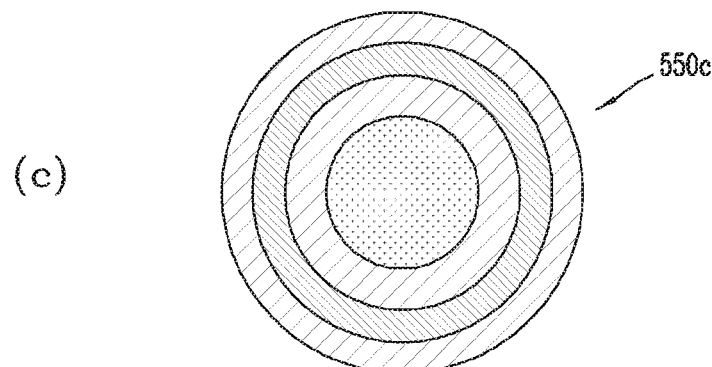

FIG. 16 are views showing shapes of semiconductor light emitting device included in a display device according to the present disclosure.

In order to minimize non-specific coupling of the semiconductor light emitting device in the self-assembly process described in FIGS. 8A through 8G, the present disclosure uses a semiconductor light emitting device having symmetry. Specifically, the semiconductor light emitting device included in the display device according to the present disclosure can be formed symmetrically with respect to a widthwise center line of the semiconductor light emitting device.

According to an embodiment, the semiconductor light emitting device can have an equilateral triangle shape 550a, as shown in (a) of FIG. 16, a square shape 550b, as shown in (b) of FIG. 16, and a circular shape 550c, as shown in (c) of FIG. 16. Although the shape of semiconductor light emitting device and the shapes of the conductive semiconductor layers and the conductive electrodes correspond in FIG. 16, such is not required, and the shape of semiconductor light emitting device can be different from the shapes of the conductive semiconductor layers and the conductive electrodes.

When a display device including semiconductor light emitting devices that emit light of different colors through self-assembly is implemented, the possibility of occurrence of nonspecific coupling increases as compared with a display device including one type of semiconductor light emitting devices.

The present disclosure can minimize the possibility of nonspecific coupling by implementing a different shape of the semiconductor light emitting device for each color of light emitted from the semiconductor light emitting device.

According to an embodiment, the semiconductor light emitting device that emits red light can be implemented as shown in (a) in FIG. 16, and the semiconductor light emitting device that emits green light as shown in (b) in FIG. 16, and the semiconductor light emitting device that emits blue light as shown in (c) in FIG. 16. On the other hand, different shapes can be associated with different color lights.

A partition wall having a shape corresponding to the red, green, and blue semiconductor light emitting devices, respectively, can be formed on the substrate. During self-assembly, any one of the red, green, and blue semiconductor light emitting devices can be placed on only between the partition walls corresponding thereto. Through this, light emitting devices with different colors can be placed only at designated positions during self-assembly.

In embodiments, the first wiring electrode and the second wiring electrode can be formed perpendicularly to each other. Also, the shape of the first conductive electrode can be different from the shape of the second conductive electrode. Additionally, a thickness of the passivation layer can be different from thicknesses of the first and second wiring electrodes.

According to the process and device of the present disclosure described above, a large number of semiconductor light emitting devices can be pixelated on a wafer having a small size, and then directly transferred onto a large-area substrate. Through this, it can be possible to fabricate a large-area display device at a low cost.

What is the claimed is:

1. A display device, comprising:
 a semiconductor light emitting device disposed on a substrate, and having a first conductive electrode disposed on an upper edge of the semiconductor light emitting device, and a second conductive electrode disposed on an upper central portion of the semiconductor light emitting device and surrounded by the first conductive electrode;

a passivation layer disposed to cover a part of an upper surface of the semiconductor light emitting device;

a first wiring electrode electrically connected to the first conductive electrode; and a second wiring electrode electrically connected to the second conductive electrode, wherein a part of the second wiring electrode overlaps with a part of the first conductive electrode with the passivation layer interposed therebetween, and wherein the first conductive electrode is disposed at a position higher than that of the second conductive electrode in a thickness direction of the semiconductor light emitting device.

2. The display device of claim 1, wherein the passivation layer is extended from a side surface of the semiconductor light emitting device in a width direction of the semiconductor light emitting device, and disposed to cover portions of the first and second conductive electrodes.

3. The display device of claim 2, wherein the passivation layer is disposed to cover a remaining portion of the upper surface of the semiconductor light emitting device excluding remaining portions of the first and second conductive electrodes respectively connected to the first and second wiring electrodes.

4. The display device of claim 1, wherein the semiconductor light emitting device is formed symmetrically with respect to a widthwise center line thereof.

5. The display device of claim 1, wherein the second conductive electrode is disposed in a recessed portion of the semiconductor light emitting device.

6. The display device of claim 1, wherein the semiconductor light emitting device further comprises:

a first conductive type semiconductor layer disposed below the first conductive electrode;

a second conductive type semiconductor layer disposed below the second conductive type electrode; and an active layer disposed between the first and second conductive type semiconductor layers.

7. The display device of claim 6, wherein a height of the first semiconductor layer is greater than a height of the second conductive electrode.

8. The display device of claim 6, wherein a height of the second conductive electrode is greater than a height of the active layer.

9. The display device of claim 6, wherein the active layer is disposed to overlap with the second conductive electrode disposed at the upper central portion of the semiconductor light emitting device.

10. The display device of claim 6, wherein the active layer is formed in an annular shape to overlap with the first conductive electrode.

11. The display device of claim 1, where the first wiring electrode and the second wiring electrode are disposed perpendicularly to each other.

12. The display device of claim 1, wherein a shape of the semiconductor light emitting device is one of a triangle, a rectangle and a circle.

13. The display device of claim 1, wherein a shape of the first conductive electrode is different from a shape of the second conductive electrode.

14. The display device of claim 1, wherein a thickness of the passivation layer is different from thicknesses of the first and second wiring electrodes.

15. The display device of claim 1, wherein the passivation layer is further formed to cover a side surface of the semiconductor light emitting device.

16. A display device, comprising:

a substrate;

a semiconductor light emitting device disposed on the substrate, and including a first conductive type semiconductor layer, a second conductive type semiconductor layer, an active layer disposed between the first and second conductive type semiconductor layers, a first conductive electrode electrically connected to the first conductive type semiconductor layer, and a second conductive electrode connected to the second conductive semiconductor layer;

a first wiring electrode electrically connected to the first conductive electrode; and a second wiring electrode electrically connected to the second conductive electrode, wherein the second conductive electrode is surrounded by the first conductive electrode, and wherein the second conductive electrode is disposed at a position higher than that of the first conductive electrode in a thickness direction of the semiconductor light emitting device.

17. The display device of claim 16, wherein the first conductive electrode is disposed on an edge of the semiconductor light emitting device, and the second conductive electrode is disposed on a central portion of the semiconductor light emitting device.

18. The display device of claim 16, wherein the first conductive electrode is disposed at a position higher than that of the second conductive electrode in a thickness direction of the semiconductor light emitting device.

19. A display device, comprising:

a substrate;

a semiconductor light emitting device disposed on the substrate, and including a first conductive type semiconductor layer, a second conductive type semiconductor layer, an active layer disposed between the first and second conductive type semiconductor layers, a first conductive electrode electrically connected to the first conductive type semiconductor layer, and a second conductive electrode connected to the second conductive semiconductor layer;

a first wiring electrode electrically connected to the first conductive electrode;

a second wiring electrode electrically connected to the second conductive electrode; and a passivation layer disposed to cover a part of an upper surface of the semiconductor light emitting device, wherein the second conductive electrode is surrounded by the first conductive electrode, and wherein a part of the second wiring electrode overlaps with a part of the first conductive electrode with the passivation layer interposed therebetween.

* * * * *